US011187958B2

(12) United States Patent
Hirano et al.

(10) Patent No.: US 11,187,958 B2
(45) Date of Patent: Nov. 30, 2021

(54) DISPLAY DEVICE AND ARRAY SUBSTRATE

(71) Applicant: Japan Display Inc., Minato-ku (JP)

(72) Inventors: Tomoyasu Hirano, Tokyo (JP); Yoshitaka Ozeki, Tokyo (JP); Koji Ishizaki, Tokyo (JP); Takahiro Takeuchi, Tokyo (JP); Koshiro Moriguchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 399 days.

(21) Appl. No.: 16/415,240

(22) Filed: May 17, 2019

(65) Prior Publication Data
US 2019/0361314 A1   Nov. 28, 2019

(30) Foreign Application Priority Data

May 22, 2018 (JP) ............................. JP2018-097939

(51) Int. Cl.
| | | |
|---|---|---|
| *G02F 1/16755* | (2019.01) | |
| *H01L 27/12* | (2006.01) | |
| *G02F 1/167* | (2019.01) | |
| *G02F 1/1681* | (2019.01) | |
| *G09G 3/34* | (2006.01) | |
| *G02F 1/16757* | (2019.01) | |
| *G02F 1/1676* | (2019.01) | |

(Continued)

(52) U.S. Cl.
CPC .......... *G02F 1/16755* (2019.01); *G02F 1/167* (2013.01); *H01L 27/1248* (2013.01); *G02B 26/026* (2013.01); *G02F 1/1676* (2019.01); *G02F 1/1681* (2019.01); *G02F 1/1685* (2019.01); *G02F 1/16756* (2019.01); *G02F 1/16757* (2019.01); *G02F 2201/123* (2013.01); *G09G 3/344* (2013.01); *G09G 3/3446* (2013.01)

(58) Field of Classification Search
CPC ...... G02F 1/167; G02F 1/1681; G02F 1/1676; G02F 1/16757; G02F 1/16755; G02F 1/16756; G02F 2201/123; G02F 1/1685; G09G 3/344; G09G 3/3446; G02B 26/026; H01L 27/1248
USPC ..... 359/296; 345/55, 58, 71, 84, 85, 93, 107
See application file for complete search history.

(56) References Cited

U.S. PATENT DOCUMENTS

| | | | | |
|---|---|---|---|---|
| 2008/0174852 A1* | 7/2008 | Hirai | ..................... | G06F 1/3203 |
| | | | | 359/296 |
| 2011/0194170 A1* | 8/2011 | Sato | ..................... | G02F 1/16756 |
| | | | | 359/296 |

(Continued)

FOREIGN PATENT DOCUMENTS

JP        2011-221097        11/2011

*Primary Examiner* — Evelyn A Lester (74) *Attorney, Agent, or Firm* — Oblon, McClelland, Maier & Neustadt, L.L.P.

(57) ABSTRACT

According to one embodiment, a display device includes a scanning line, a semiconductor layer, a first inorganic insulating film located between the scanning line and the semiconductor layer, a first signal line, a second inorganic insulating film having a main surface which contacts the first signal line and located between the semiconductor layer and the first signal line, a capacitance electrode contacting the main surface, a pixel electrode overlapping the capacitance electrode, and a third inorganic insulating film covering the first signal line and the capacitance electrode and located between the first signal line and the pixel electrode and between the capacitance electrode and the pixel electrode.

19 Claims, 10 Drawing Sheets

(51) Int. Cl.
  *G02B 26/02*   (2006.01)
  *G02F 1/16756* (2019.01)
  *G02F 1/1685*  (2019.01)

(56) References Cited

U.S. PATENT DOCUMENTS

| | | | | |
|---|---|---|---|---|
| 2011/0205195 | A1* | 8/2011 | Komatsu | G09G 3/344 345/204 |
| 2011/0285756 | A1* | 11/2011 | Sato | G02F 1/167 345/690 |
| 2012/0293760 | A1* | 11/2012 | Masuda | H01L 27/1218 359/296 |
| 2014/0354612 | A1* | 12/2014 | Okamoto | G06F 3/0412 345/204 |
| 2019/0302565 | A1* | 10/2019 | Takeuchi | G02F 1/1343 |

* cited by examiner

DISPLAY DEVICE AND ARRAY SUBSTRATE

CROSS-REFERENCE TO RELATED APPLICATIONS

This application is based upon and claims the benefit of priority from Japanese Patent Application No. 2018-097939, filed May 22, 2018, the entire contents of which are incorporated herein by reference.

FIELD

Embodiments described herein relate generally to a display device and an array substrate.

BACKGROUND

In one example, an electrophoretic display device which holds an electrophoretic element between an element substrate and a counter-substrate is disclosed. It is disclosed that, according to the electrophoretic display device, a capacitance electrode is formed across almost the entire surface of a display portion and all pixel electrodes overlap the capacitance electrode. In the electrophoretic display device, an organic planarizing film is formed between a signal line and the capacitance electrode. The organic planarizing film moderates a level difference reflecting the shape of a conductive layer and planarizes the surface of a substrate.

DETAILED DESCRIPTION

In general, according to one embodiment, there is provided a display device comprising a first substrate comprising a base, a scanning line located above the base, a semiconductor layer, a first inorganic insulating film located between the scanning line and the semiconductor layer, a first signal line crossing the scanning line and electrically connected to the semiconductor layer, a second inorganic insulating film having a main surface which contacts the first signal line and located between the semiconductor layer and the first signal line, a capacitance electrode contacting the main surface, a pixel electrode overlapping the capacitance electrode, and a third inorganic insulating film covering the first signal line and the capacitance electrode and located between the first signal line and the pixel electrode and between the capacitance electrode and the pixel electrode, a second substrate comprising a common electrode, and an electrophoretic element located between the pixel electrode and the common electrode.

According to another embodiment, there is provided an array substrate comprising a base, a scanning line located above the base, a semiconductor layer, a first inorganic insulating film located between the scanning line and the semiconductor layer, a signal line crossing the scanning line and electrically connected to the semiconductor layer, a second inorganic insulating film having a main surface which contacts the signal line and located between the semiconductor layer and the signal line, a capacitance electrode contacting the main surface, a pixel electrode overlapping the capacitance electrode, and a third inorganic insulating film covering the signal line and the capacitance electrode and located between the signal line and the pixel electrode and between the capacitance electrode and the pixel electrode.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by the same reference numbers, detailed description thereof being omitted unless necessary.

Figure 1:
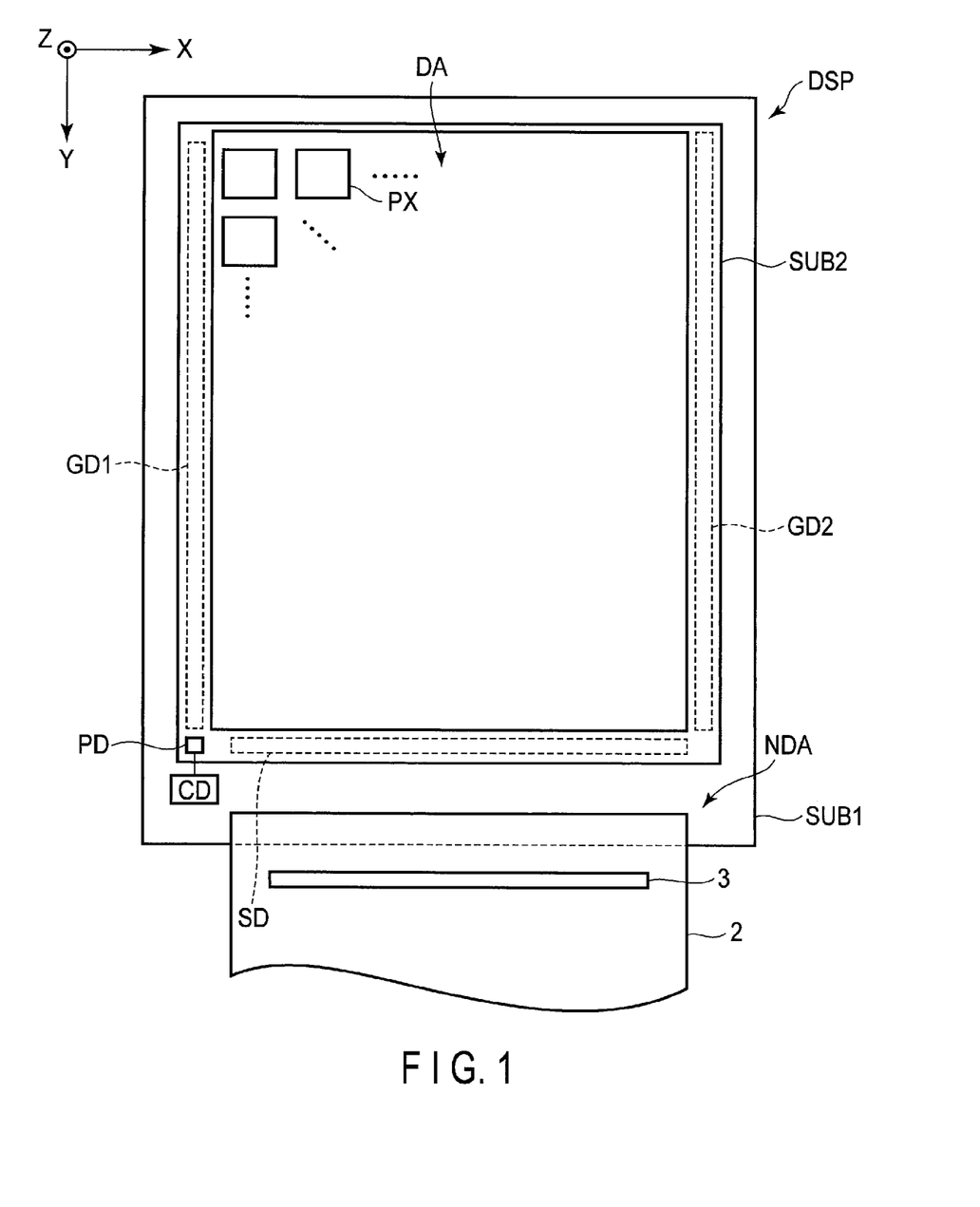
FIG. 1 is a plan view showing an example of a display device DSP of the present embodiment.

FIG. 1 is a plan view showing an example of a display device DSP of the embodiment. A first direction X, a second direction Y and a third direction Z orthogonally cross each other in one example but may cross at an angle other than 90 degrees. The first direction X and the second direction Y correspond to directions parallel to a main surface of a substrate constituting the display device DSP, and the third direction Z corresponds to a thickness direction of the display device DSP. In the specification, a position on the front end side of an arrow indicating the third direction Z will be referred to as an upper side (or simply above) and a position on the rear end side of the arrow will be referred to as a lower side (or simply below). When described as "a second member above a first member" or "a second member below a first member", the second member may be in contact with the first member or may be separated from the first member. In addition, an observation position at which the display device DSP is observed is assumed to be located on the front end side of the arrow indicating the third direction Z, and a view from this observation position toward an X-Y plane defined by the first direction X and the second direction Y will be referred to as planar view.

The display device DSP comprises a first substrate SUB1 and a second substrate SUB2. A display portion DA in which an image is displayed is located in an area in which the first substrate SUB1 and the second substrate SUB2 overlap each other in planar view. The display portion DA comprises a plurality of pixels PX arrayed in a matrix in the first direction X and the second direction Y. A non-display portion NDA around the display portion DA is formed in a frame shape. Gate drivers GD1 and GD2 and a source driver SD are located in the non-display portion NDA and are provided in the first substrate SUB1. In addition, a feeding pad PD is located in the non-display portion NDA, is provided in the first substrate SUB1 and overlaps the second substrate SUB2. The feeding pad PD is connected to a power source CD at a common potential.

A flexible printed circuit board 2 is connected to the first substrate SUB1. An IC chip 3 is connected to the flexible printed circuit board 2. Note that the IC chip 3 may be connected to the first substrate SUB1. The gate drivers GD1 and GD2, the source driver SD and the power source CD may be incorporated in the IC chip 3.

Figure 2:
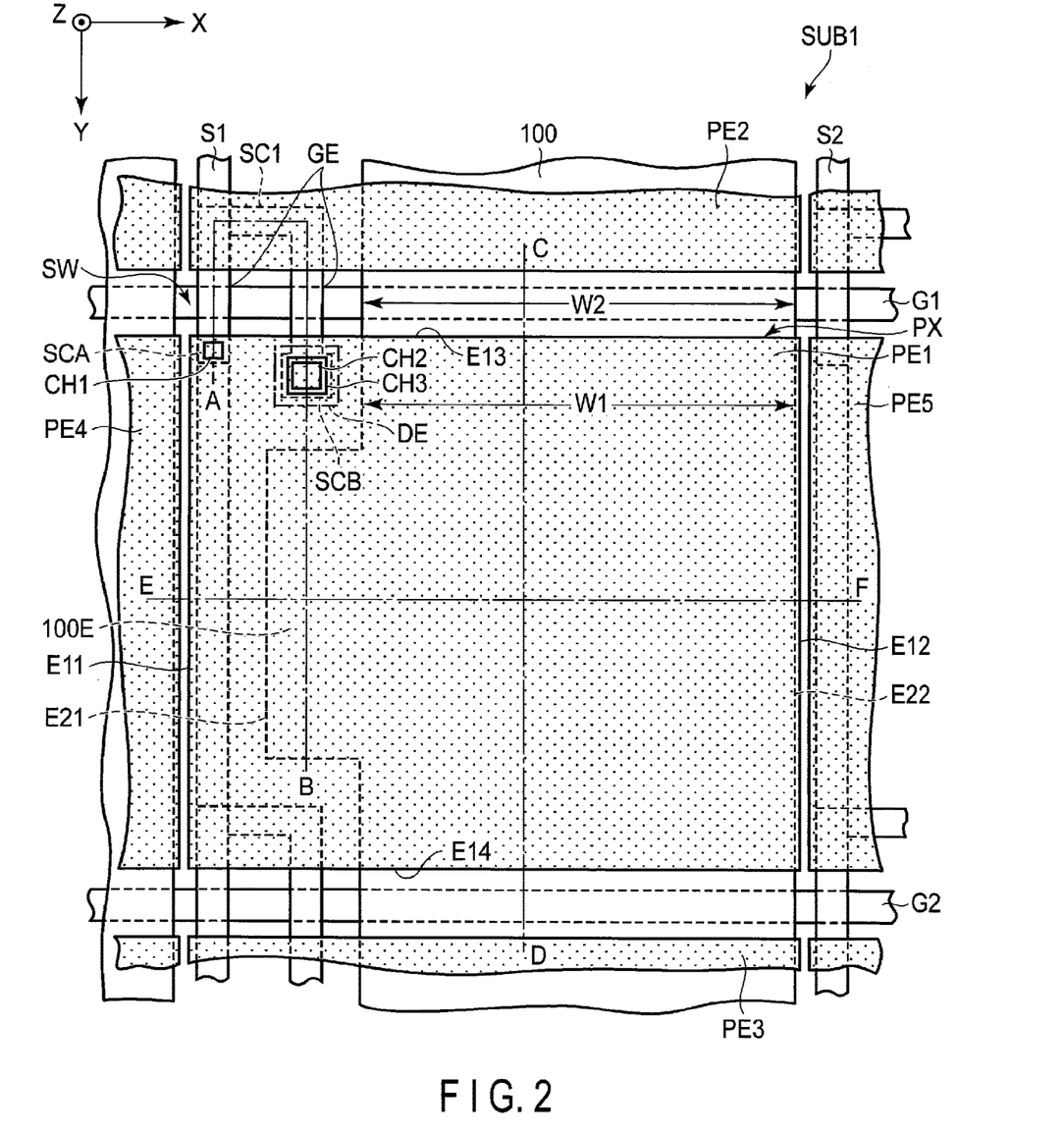
FIG. 2 is a plan view showing the first configuration example of a pixel PX of the display device DSP shown in FIG. 1.

FIG. 2 is a plan view showing the first configuration example of the pixel PX of the display device DSP shown in FIG. 1. Here, only main elements provided in the first substrate SUB1 shown in FIG. 1 of the pixel PX are illustrated in the drawing. The first substrate SUB1 comprises scanning lines G1 and G2, signal lines S1 and S2, a switching element SW, a capacitance electrode 100 and pixel electrodes PE1 to PE5.

The scanning lines G1 and G2 are arranged and spaced apart from each other in the second direction Y. The scanning lines G1 and G2 extend in the first direction X and are each connected to one of the gate drivers GD1 and G2 shown in FIG. 1. The signal lines S1 and S2 are arranged and spaced apart from each other in the first direction X. The signal lines S1 and S2 extend in the second direction Y and are connected to the source driver SD shown in FIG. 1. Each of the signal lines S1 and S2 crosses the scanning lines G1 and G2.

The switching element SW is located in an intersection portion of the scanning line G1 and the signal line S1. The switching element SW comprises a semiconductor layer SC1, a gate electrode GE and a drain electrode DE. Although the switching element SW illustrated in the drawing has a double-gate structure, the switching element SW may have a single-gate structure. In addition, the switching element SW may have such a top-gate structure that the gate electrode GE is disposed above the semiconductor layer SC1 or may have such a bottom-gate structure that the gate electrode GE is disposed below the semiconductor layer SC1.

The semiconductor layer SC1 comprises an end portion SCA overlapping the signal line S1 and an end portion SCB overlapping the drain electrode DE. The end portion SCA is electrically connected to the signal line S1 in a through hole CH1. The end portion SCB is electrically connected to the drain electrode DE in a through hole CH2. The semiconductor layer SC1 crosses the scanning line G1 between the end portion SCA and the end portion SCB. The gate electrode GE corresponds to areas overlapping the semiconductor layer SC1 of the scanning line G1. The drain electrode DE is formed in an island shape and is located between the signal lines S1 and S2.

The capacitance electrode 100 extends in a strip shape in the second direction Y, overlaps the pixel electrodes PE1 to PE3 arranged in the second direction Y in planar view, and crosses both of the scanning lines G1 and G2. The capacitance electrode 100 is connected to the power source CD at the common potential shown in FIG. 1. The capacitance electrode 100 is located between the signal line S1 and the signal line S2 and between the signal line S2 and the drain electrode DE. The capacitance electrode 100 is separated from all of the drain electrode DE and the signal lines S1 and S2. In the example illustrated, the capacitance electrode 100 has a projecting portion 100E which projects toward the signal line S1. The projecting portion 100E is separated from the drain electrode DE and the signal line S1. Note that the shape of the projecting portion 100E can be appropriately selected in accordance with a required capacitance C1 of the pixel PX.

The capacitance electrode 100 has a width W1 between the drain electrode DE and the signal line S2. The capacitance electrode 100 has a width W2 at a position crossing the scanning line G1. A width in the specification is assumed to be a length in the first direction X. Although the width W1 and the width W2 are substantially the same in the example illustrated, the width W2 may be less than the width W1.

The pixel electrode PE1 overlaps the capacitance electrode 100, the signal line S1, the semiconductor layer SC1 and the drain electrode DE in the pixel PX. The pixel electrode PE1 is located between the scanning line G1 and the scanning line G2. The pixel electrode PE1 is separated from both of the scanning lines G1 and G2 in planar view. The pixel electrode PE1 is electrically connected to the drain electrode DE in a through hole CH3. The pixel electrode PE1 is formed in such a square shape that the length in the first direction X and the length in the second direction Y are the same in the example illustrated, but a shape of the pixel electrode PE1 is not limited to this example. The pixel electrode PE1 may be formed in a rectangular shape extending in the first direction X or the second direction Y or may be formed in another polygonal shape.

As illustrated in the drawing, four pixel electrodes PE2 to PE5 are arranged around the pixel electrode PE1. The pixel electrode PE2, the pixel electrode PE1 and the pixel electrode PE3 are arranged in this order in the second direction Y and overlap the capacitance 100. Note that the pixel electrode PE2, the pixel electrode PE1 and the pixel electrode PE3 overlap the signal line S1 in the example illustrated but may overlap the signal line S2 or may not overlap either of the signal lines S1 and S2. The pixel electrode PE4, the pixel electrode PE1 and the pixel electrode PE5 are arranged in this order in the first direction X. While the capacitance electrode 100 exists between the pixel electrode PE2 and the pixel electrode PE1 and between the pixel electrode PE1 and the pixel electrode PE3, the capacitance electrode 100 does not exist between the pixel electrode PE4 and the pixel electrode PE1 and between the pixel electrode PE1 and the pixel electrode PE5.

The pixel electrode PE1 has edge portions E11 to E14. The edge portion E11 is an edge portion close to the signal line S1 and the pixel electrode PE4. The edge portion E12 is an edge portion close to the signal line S2 and the pixel electrode PE5. The edge portion E13 is an edge portion close to the scanning line G1 and the pixel electrode PE2. The edge portion E14 is an edge portion close to the scanning line G2 and the pixel electrode PE3. The edge portions E11 and E12 extend in the second direction Y. The edge portions E13 and E14 extend in the first direction X and overlap the capacitance electrode 100.

The capacitance electrode 100 has edge portions E21 and E22. The edge portion E21 is an edge portion close to the signal line S1 and the pixel electrode PE4. The edge portion E22 is an edge portion close to the signal line S2 and the pixel electrode PE5. The edge portions E21 and E22 are located between the signal line S1 and the signal line S2 and are not in contact with either of the signal lines S1 and S2. In addition, the edge portions E21 and E22 are located between the edge portion E11 and the edge portion E12 of the pixel electrode PE1. The edge portion E11 may overlap the edge portion E21. In addition, the edge portion E12 may overlap the edge portion E22.

Figure 3:
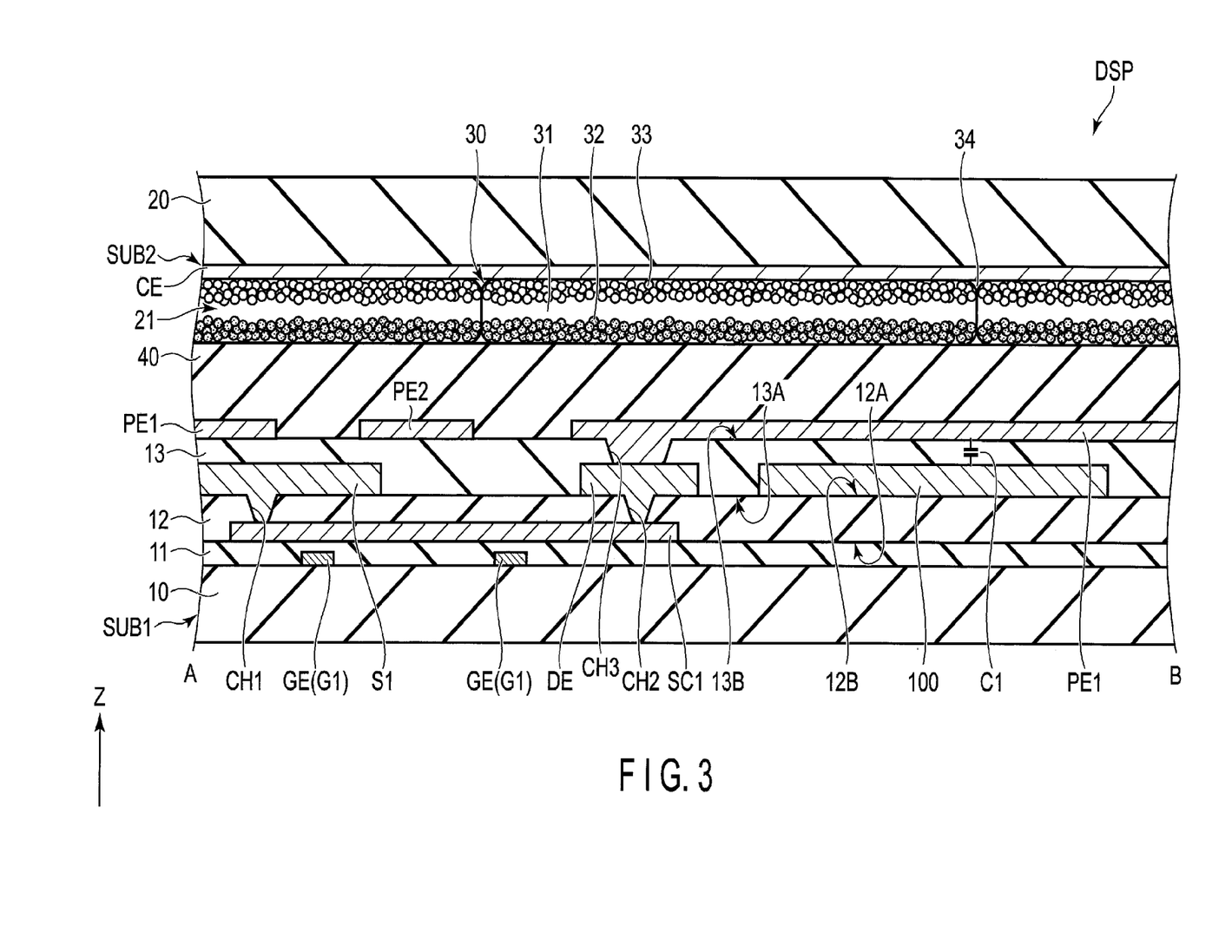
FIG. 3 is a cross-sectional view taken along line A-B of the display device DSP including the pixel PX shown in FIG. 2.

FIG. 3 is a cross-sectional view taken along line A-B of the display device DSP including the pixel PX shown in FIG. 2. The first substrate SUB1 further comprises a base 10 and insulating films 11 to 13. The base 10 is an insulating substrate formed of an insulating glass or resin such as polyimide resin. Since the base 10 is located on the opposite side to the observation position with reference to the second substrate SUB2, the base 10 may be a non-transparent base or may be a transparent base.

The gate electrode GE, which is integrally formed with the scanning line G1, is located on the based 10 and is covered with the insulating film 11. The scanning line G1 and the gate electrode GE are formed of a metal material such as aluminum (Al), titanium (Ti), silver (Ag), molybdenum (Mo), tungsten (W), copper (Cu) or chromium (Cr), an alloy of these metal materials or the like, and may have a single-layer structure or a multilayer structure. The semiconductor layer SC1 is located on the insulating film 11 and is covered with the insulating film 12. The semiconductor layer SC1 is formed of, for example, polycrystalline silicon (for example, low-temperature polysilicon) but may be formed of amorphous silicon or an oxide semiconductor. In the example illustrated, the insulating film 11 is located between the semiconductor layer SC1 and the scanning line G1 and is in contact with the base 10 and the insulating film 12. The insulating film 12 has a main surface (lower surface) 12A which is in contact with the insulating film 11 and a main surface (upper surface) 12B which is located on the opposite side to the main surface 12A.

The signal line S1, the drain electrode DE and the capacitance electrode 100 are in contact with the main surface 12B of the insulating film 12 and are covered with the insulating film 13. The signal line S1, the drain electrode DE and the capacitance electrode 100 are formed of the same material and are formed of, for example, the above-described metal material. The signal line S1 is in contact with the semiconductor layer SC1 in the through hole CH1 penetrating the insulating film 12. The drain electrode DE is in contact with the semiconductor layer SC1 in the through hole CH2 penetrating the insulating film 12. In the example illustrated, the insulating film 12 is located between the semiconductor layer SC1 and the signal line S1. The insulating film 13 has a main surface (lower surface) 13A which is in contact with the insulating film 12 and a main surface (upper surface) 13B which is located on the opposite side to the main surface 13A. The main surface 13A is in contact with the main surface 12B between the signal line S1 and the drain electrode DE and between the capacitance electrode 100 and the drain electrode DE.

The pixel electrodes PE1 and PE2 are in contact with the main surface 13B of the insulating film 13. The pixel electrode PE1 is in contact with the drain electrode DE in the through hole CH3 penetrating the insulating film 13. The pixel electrodes PE1 and PE2 are transparent electrodes formed of, for example, a transparent conductive material such as indium tin oxide (ITO) or indium zinc oxide (IZO). The pixel electrode PE1 overlaps the capacitance electrode 100 via the insulating film 13 and produces the capacitance C1 of the pixel PX. In the example illustrated, the insulating film 11 is in contact with the base 10 and the main surface 12A and the capacitance electrode 100 is in contact with the main surface 12B at a position at which the pixel electrode PE1 and the capacitance electrode 100 overlap each other. That is, the insulating films 11 and 12 exist but no conductive layer exists between the base 10 and the capacitance electrode 100. Therefore, an area with which the capacitance electrode 100 is in contact of the main surface 12B is substantially flat.

All of the insulating films 11 to 13 correspond to an inorganic insulating film formed of an inorganic material such as silicon oxide (SiO), silicon nitride (SiN) or silicon nitride (SiON). Each of the insulating films 11 to 13 may have a single-layer structure or a multilayer structure. Each of the insulating films 11 to 13 has a film thickness of, for example, 0.1 μm to 0.5 μm.

In the first configuration example, the signal line S1 corresponds to the first signal line, the signal line S2 corresponds to the second signal line, the insulating films 11 to 13 correspond to the first inorganic insulating film to the third inorganic insulating film, respectively, the main surface 12B corresponds to the main surface, the edge portion E11 corresponds to the first edge portion, the edge portion E12 corresponds to the second edge portion, the edge portion E21 corresponds to the third edge portion, the edge portion E22 corresponds to the fourth edge portion, and the first substrate SUB1 corresponds to the array substrate.

The second substrate SUB2 comprises a base 20, a common electrode CE and an electrophoretic element 21. In the example illustrated, the second substrate SUB2 does not comprise a light-shielding layer which delimits the pixels PX. The base 20 is formed of insulating glass or resin such as polyimide resin. Since the base 20 is located on the observation position side with reference to the first substrate SUB1, the base 20 is a transparent base. The common electrode CE is located between the base 20 and the electrophoretic element 21. The common electrode CE is a transparent electrode formed of a transparent conductive material such as ITO or IZO. The common electrode CE is electrically connected to the feeding pad PD in the non-display portion NDA shown in FIG. 1. That is, the common electrode CE is at the same potential as the capacitance electrode 100. The electrophoretic element 21 is located between the pixel electrode PE1 and the common electrode CE. The electrophoretic element 21 is formed of a plurality of microcapsules 30 arrayed such that there is little space between them in the X-Y plane.

The first substrate SUB1 and the second substrate SUB2 are bonded together by an adhesive layer 40. In the example illustrated, the adhesive layer 40 is located between the pixel electrodes PE1 and PE2 and the electrophoretic element 21. The electrophoretic element 21 is bonded to the main surface 13B of the insulating film 13 by the adhesive layer 40 between the pixel electrode PE1 and the pixel electrode PE2.

The microcapsules 30 have a particle diameter of, for example, about 20 μm to 70 μm. A plurality of microcapsules 30 are disposed between one pixel electrode PE1 and the common electrode CE. About one to ten microcapsules 30 are disposed on the pixel electrode PE1 formed in such a rectangular shape or polygonal shape that the length of one side is about one hundred to several hundred micrometers, for example.

The microcapsule 30 comprises dispersing medium 31, a plurality of black particles 32 and a plurality of white particles 33. The black particles 32 and the white particles 33 may be referred to as electrophoretic particles in some cases. An outer shell 34 of the microcapsule 30 is formed of, for example, transparent resin such as acrylic resin. The dispersing medium 31 is a liquid which disperses the black particles 32 and the white particles 33 within the microcapsule 30. The black particles 32 and the white particles 33 have opposite electric charges. For example, the black particles 32 are positively charged and the white particles 33 are negatively charged. Other than the black particle 32 and the white particle 33, the microcapsule 30 may comprise electrophoretic particles of other colors such as red, green, blue, yellow, cyan, magenta and the like. In addition, the electrophoretic particles of the other colors may be replaced with at least one of the black particle 32 and the white particle 33.

In the electrophoretic element 21 of the above-described configuration, when the pixel PX displays black, the pixel electrode PE1 is held at a potential relatively higher than that of the common electrode CE. That is, when the potential of the common electrode CE is assumed to be a reference potential, the pixel electrode PE1 is held in positive polarity. Consequently, while the positively charged black particles 32 are attracted to the common electrode CE, the negatively charged white particles 33 are attracted to the pixel electrode PE1. As a result, when the pixel PX is observed from the upper side of the second substrate SUB2, black is viewed.

On the other hand, when the pixel PX displays white, the pixel electrode PE1 is held at a potential relatively lower than that of the common electrode CE. That is, when the potential of the common electrode CE is assumed to be a reference potential, the pixel electrode PE1 is held in negative polarity. Consequently, while the negatively charged white particles 33 are attracted to the common electrode CE, the positively charged black particles 32 are attracted to the pixel electrode PE1. As a result, when the pixel PX is observed, white is viewed.

Figure 4:
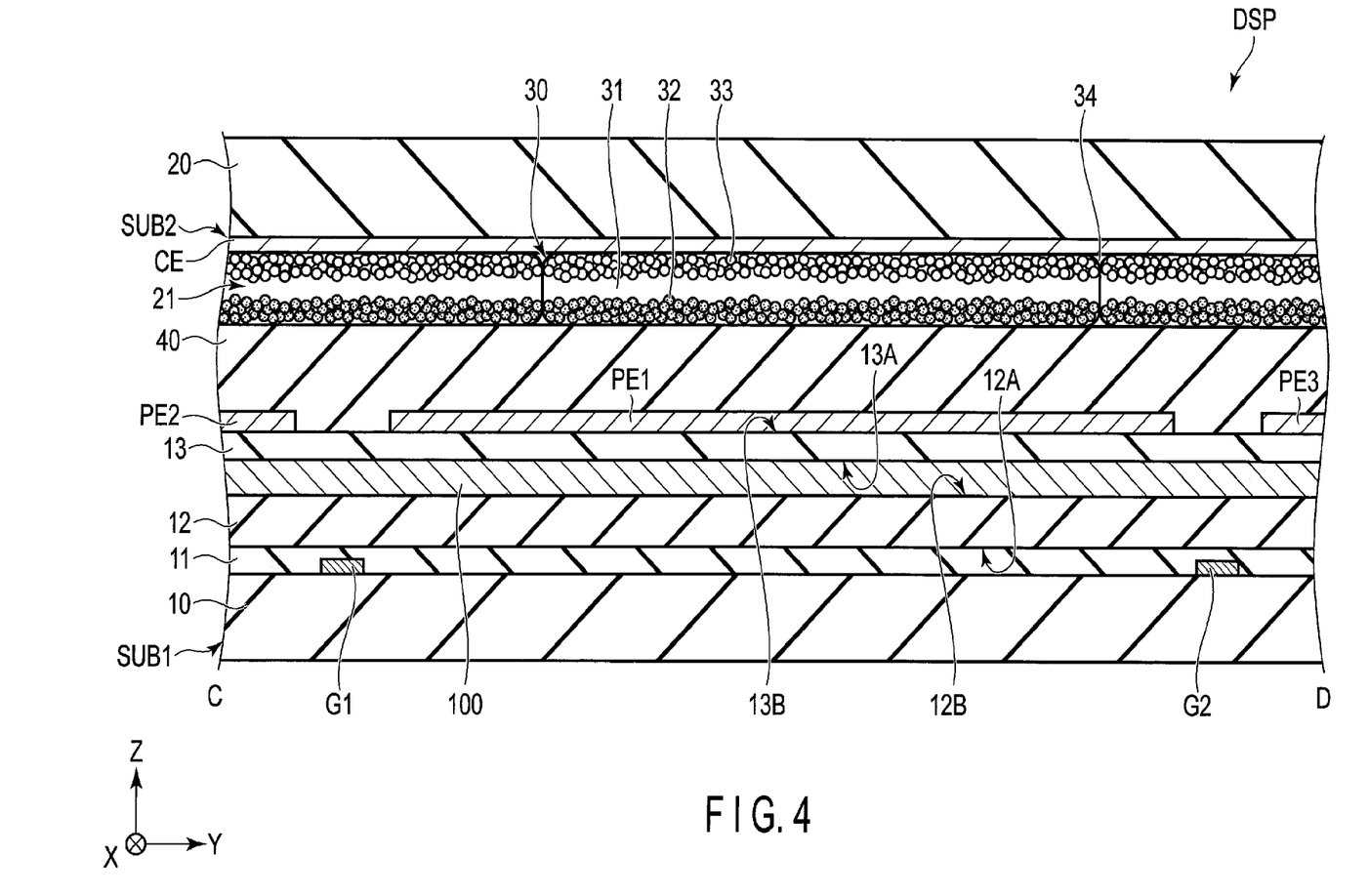
FIG. 4 is a cross-sectional view taken along line C-D of the display device DSP including the pixel PX shown in FIG. 2.

FIG. 4 is a cross-sectional view taken along line C-D of the display device DSP including the pixel PX shown in FIG. 2. The scanning lines G1 and G2 are located on the base 10. The insulating film 11 is in contact with the main surface 12A, and the capacitance electrode 100 is in contact with the main surface 12B. The capacitance electrode 100 is in contact with the main surface 13A, and the pixel electrodes PE1 to PE3 are in contact with the main surface 13B. The adhesive layer 40 is in contact with the insulating film 13 between the pixel electrode PE1 and the pixel electrode PE2 and between the pixel electrode PE1 and the pixel electrode PE3.

Figure 5:
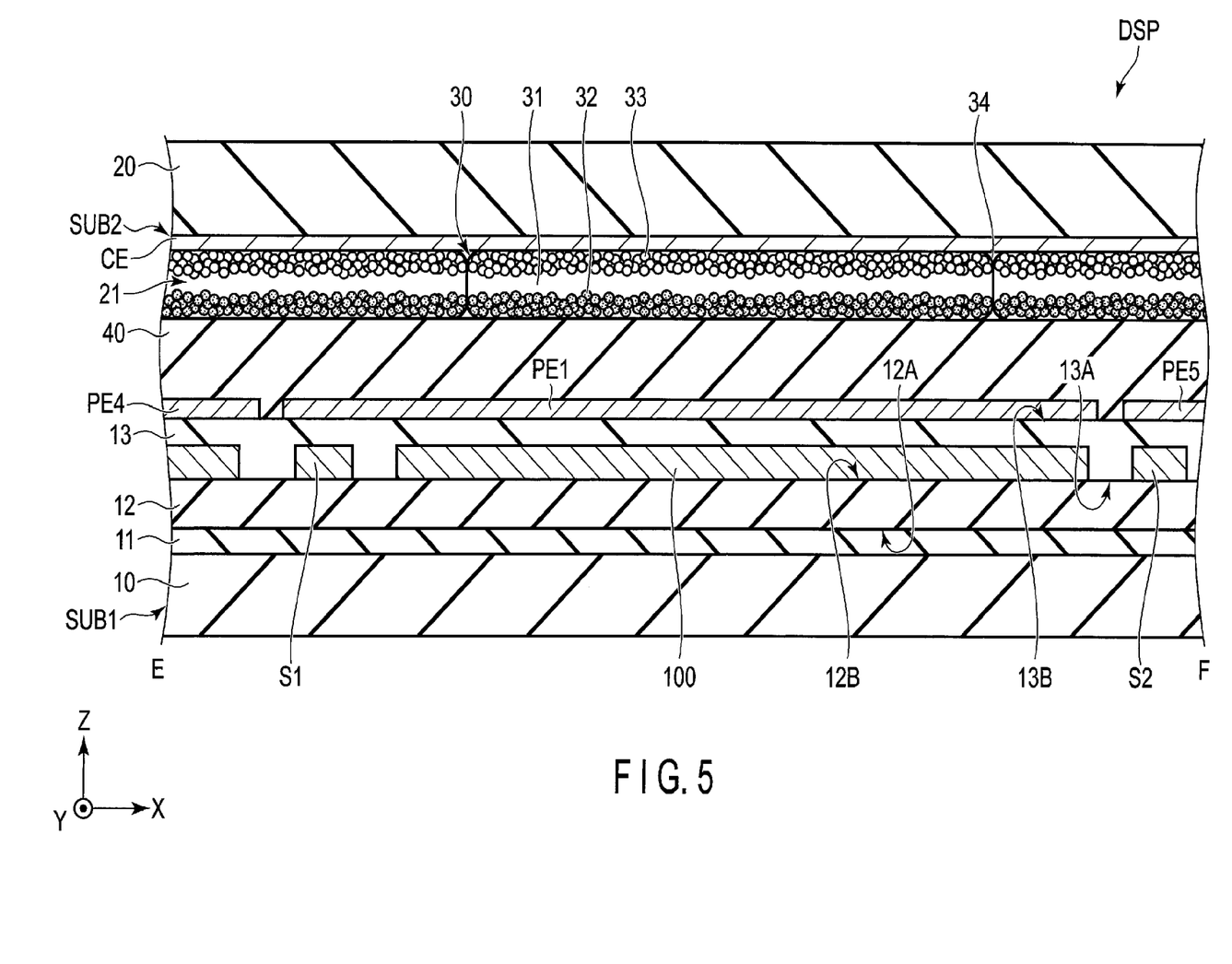
FIG. 5 is a cross-sectional view taken along line E-F of the display device DSP including the pixel PX shown in FIG. 2.

FIG. 5 is a cross-sectional view taken along line E-F of the display device DSP including the pixel PX shown in FIG. 2. The signal lines S1 and S2 are in contact with the main surface 12B. The main surface 13A of the insulating film 13 is in contact with the main surface 12B between the signal line S1 and the capacitance electrode 100 and between the signal line S2 and the capacitance electrode 100. The pixel electrodes PE1, PE4 and PE5 are in contact with the main surface 13B. The adhesive layer 40 is in contact with the insulating film 13 between the pixel electrode PE1 and the pixel electrode PE4 and between the pixel electrode PE1 and the pixel electrode PE5.

According to the present embodiment, the signal lines S1 and S2, the drain electrode DE and the capacitance electrode 100 are located on the inorganic insulating film 12 and are covered with the inorganic insulating film 13. In addition, in the process of forming the signal line, etc., the capacitance electrode 100 is also formed simultaneously. For this reason, the process of forming the capacitance electrode 100 separately will not be required and the process of forming an insulating film between the signal line, etc., and the common electrode 100 can be omitted. Consequently, in the case of manufacturing the first substrate SUB1, the manufacturing processes can be simplified and the manufacturing costs can be reduced. In addition, as compared to a case where an insulating film is interposed between the signal line, etc., and the capacitance electrode 100, the first substrate SUB1 can be thinned.

Furthermore, an inorganic insulating film is less water absorptive as compared to an organic insulating film, and the initial amount of moisture is small and the amount of moisture to be released is small. Therefore, corrosion of the signal lines S1 and S2, the drain electrode DE and the capacitance electrode 100 can be suppressed. Furthermore, all of the insulating films 11 to 13 are inorganic insulating films, and the degree of contact between the insulating films can be improved and moisture pathways at the interfaces of the insulating films can be blocked. Furthermore, moisture pathways to the electrophoretic element 21 via the adhesive layer 40 can be blocked.

Furthermore, the edge portions E21 and E22 of the capacitance electrode 100 do not extend on the outside of the pixel electrode PE1. Consequently, leakage of an undesirable electric field impacting the electrophoretic element 21 from the capacitance electrode 100 can be suppressed.

Furthermore, as shown in FIGS. 3 to 5, no conductive layer exists between the capacitance electrode 100 and the base 10 at a position at which the capacitance electrode 100 and the pixel electrode PE1 overlap each other. Therefore, the main surface 12B of the insulating film 12 with which the capacitance electrode 100 is in contact is substantially planarized.

Next, other configuration examples will be described. Note that the same structures as those of the first configuration example may be denoted by the same reference numbers and detailed descriptions may be omitted in each of the configuration examples.

Figure 6:
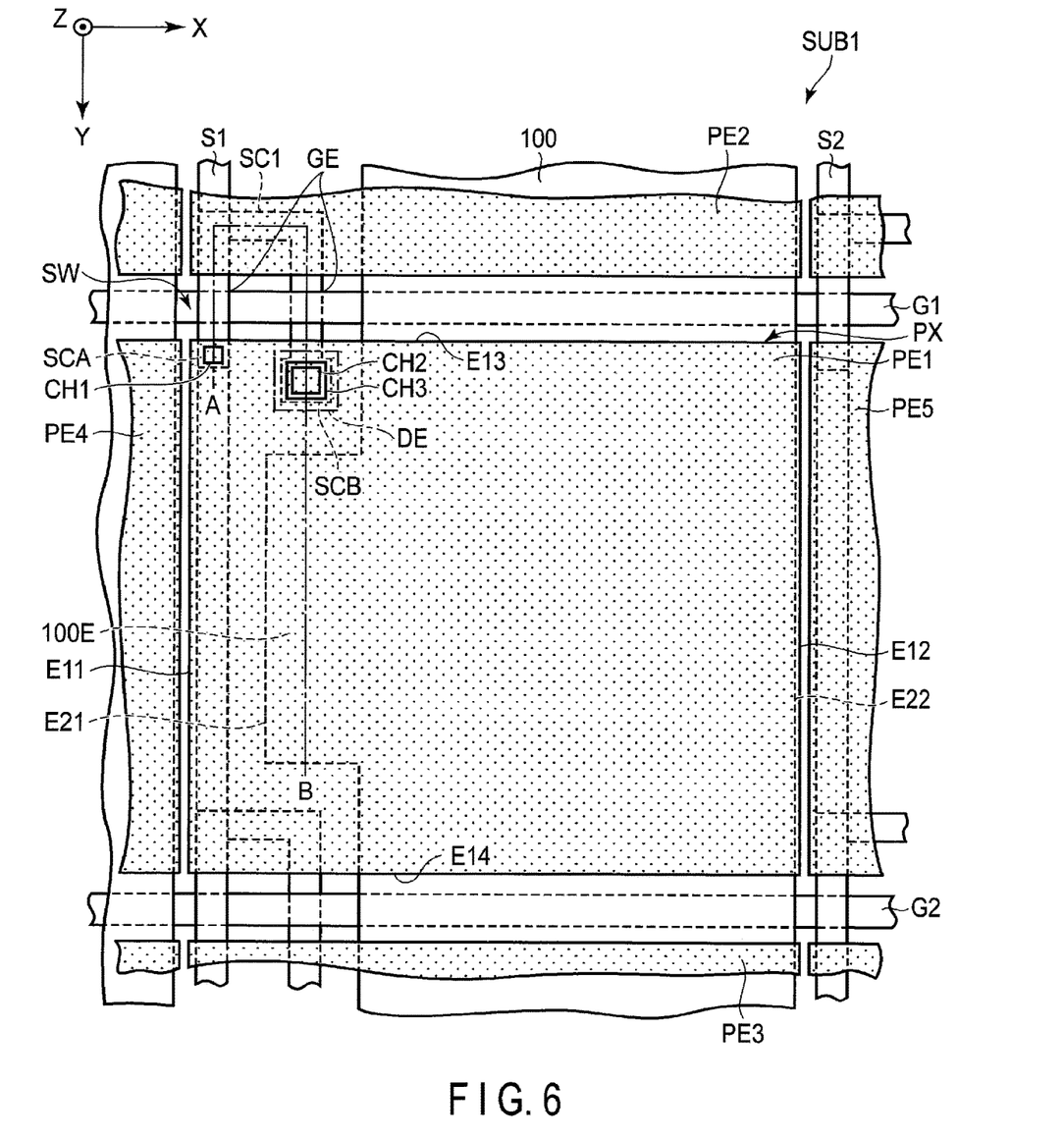
FIG. 6 is a plan view showing the second configuration example of the pixel PX of the display device DSP shown in FIG. 1.
Figure 7:
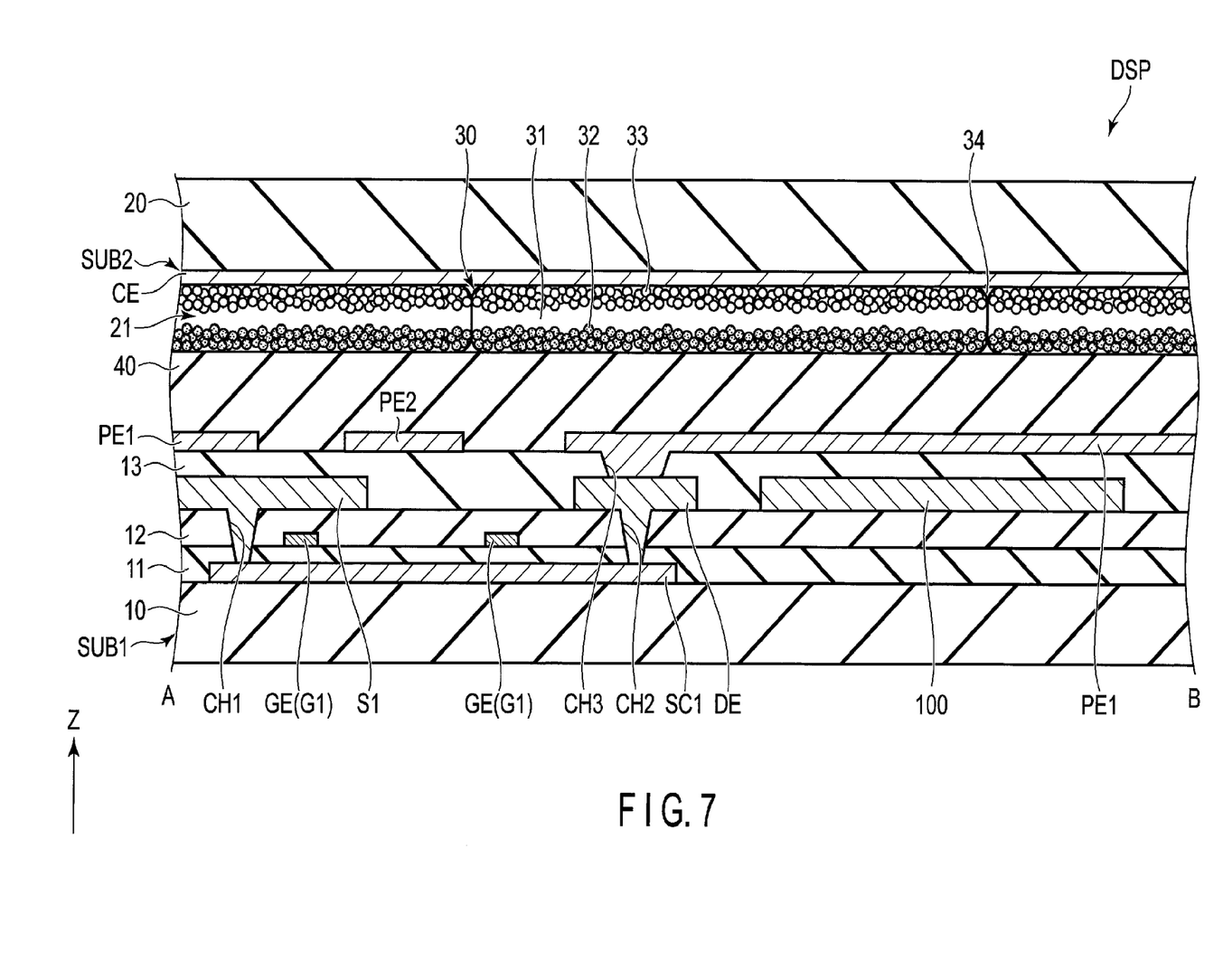
FIG. 7 is a cross-sectional view showing the second configuration example of the pixel PX of the display device DSP shown in FIG. 1.

FIG. 6 is a plan view showing the second configuration example of the pixel PX of the display device DSP shown in FIG. 1. FIG. 7 is a cross-sectional view taken along line A-B of the display device DSP including the pixel PX shown in FIG. 6. The second configuration example shown in FIGS. 6 and 7 differs from the first configuration example shown in FIGS. 2 and 3 in that the switching element SW has a top-gate structure. That is, the semiconductor layer SC1 is located between the base 10 and the insulating film 11. Note that another insulating film may be interposed between the base 10 and the semiconductor layer SC1. The gate electrode GE, which is integrally formed with the scanning line G, is located between the insulating film 11 and the insulating film 12. The signal line S1 is in contact with the semiconductor layer SC1 in the through hole CH1 penetrating the insulating films 11 and 12. The drain electrode DE is in contact with the semiconductor layer SC1 in the through hole CH2 penetrating the insulating films 11 and 12. The other structures are the same as those of the first configuration example.

Also in the second configuration example, substantially the same effects as those of the first configuration example described above can be obtained.

Figure 8:
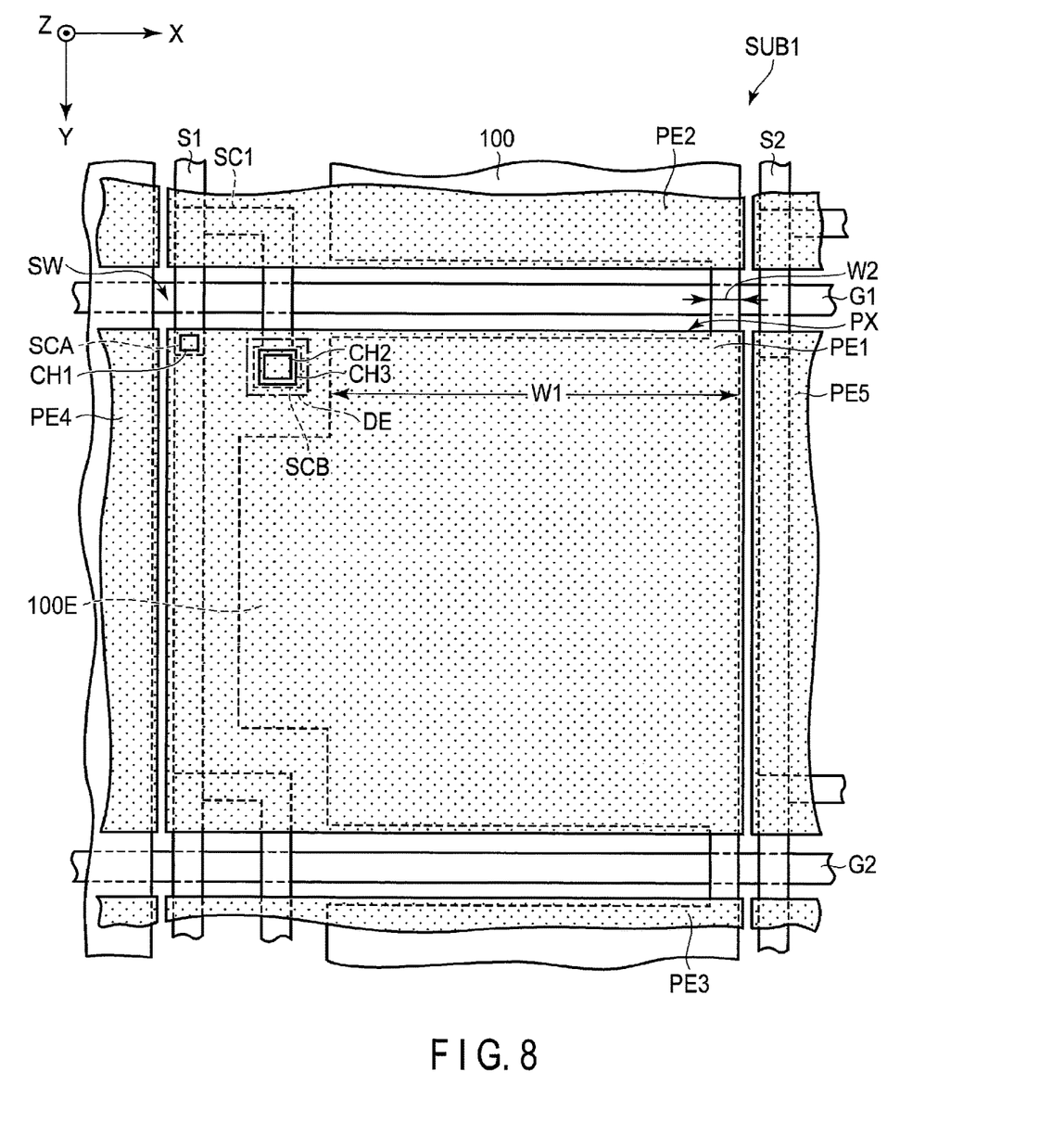
FIG. 8 is a plan view showing the third configuration example of the pixel PX of the display device DSP shown in FIG. 1.

FIG. 8 is a plan view showing the third configuration example of the pixel PX of the display device DSP shown in FIG. 1. The third configuration example shown in FIG. 8 differs from the first configuration example shown in FIG. 2 in the shape of the capacitance electrode 100. The capacitance electrode 100 has the width W1 at a position which does not overlap the scanning lines G1 and G2, for example, between the drain electrode DE and the signal line S2. The capacitance electrode 100 has a width W2 less than the width W1 at a position overlapping the scanning line G1. The capacitance electrode 100 also has the width W2 at a position overlapping the other scanning line G2. From another point of view, the capacitance electrode 100 has the width W1 at a position overlapping the pixel electrode PE1. The capacitance electrode 100 has the width W2 less than the width W1 on the outside of the pixel electrode PE1, between the pixel electrode PE1 and the pixel electrode PE2, or at a position which do not overlap the pixel electrode PE1 and the pixel electrode PE2.

Also in the third configuration example, substantially the same effects as those of the first configuration example described above can be obtained. In addition, since the capacitance electrode 100 is narrowed at a position crossing the scanning line G1, a parasitic capacitance between the capacitance electrode 100 and the scanning line G1 can be reduced. Furthermore, since the capacitance electrode 100 is narrowed at a position which does not overlap the pixel electrode PE1, leakage of an undesirable electric field impacting the electrophoretic element 21 from the capacitance electrode 100 can be further suppressed. Note that the capacitance electrode 100 is formed of substantially the same metal material as the signal line, etc., and as compared to a case where the capacitance electrode 100 is formed of a transparent conductive material, an increase in wiring line resistance due to the narrowing of the capacitance electrode 100 can be suppressed.

In the third configuration example shown in FIG. 8, the width W1 corresponds to the first width and the width W2 corresponds to the second width.

Figure 9:
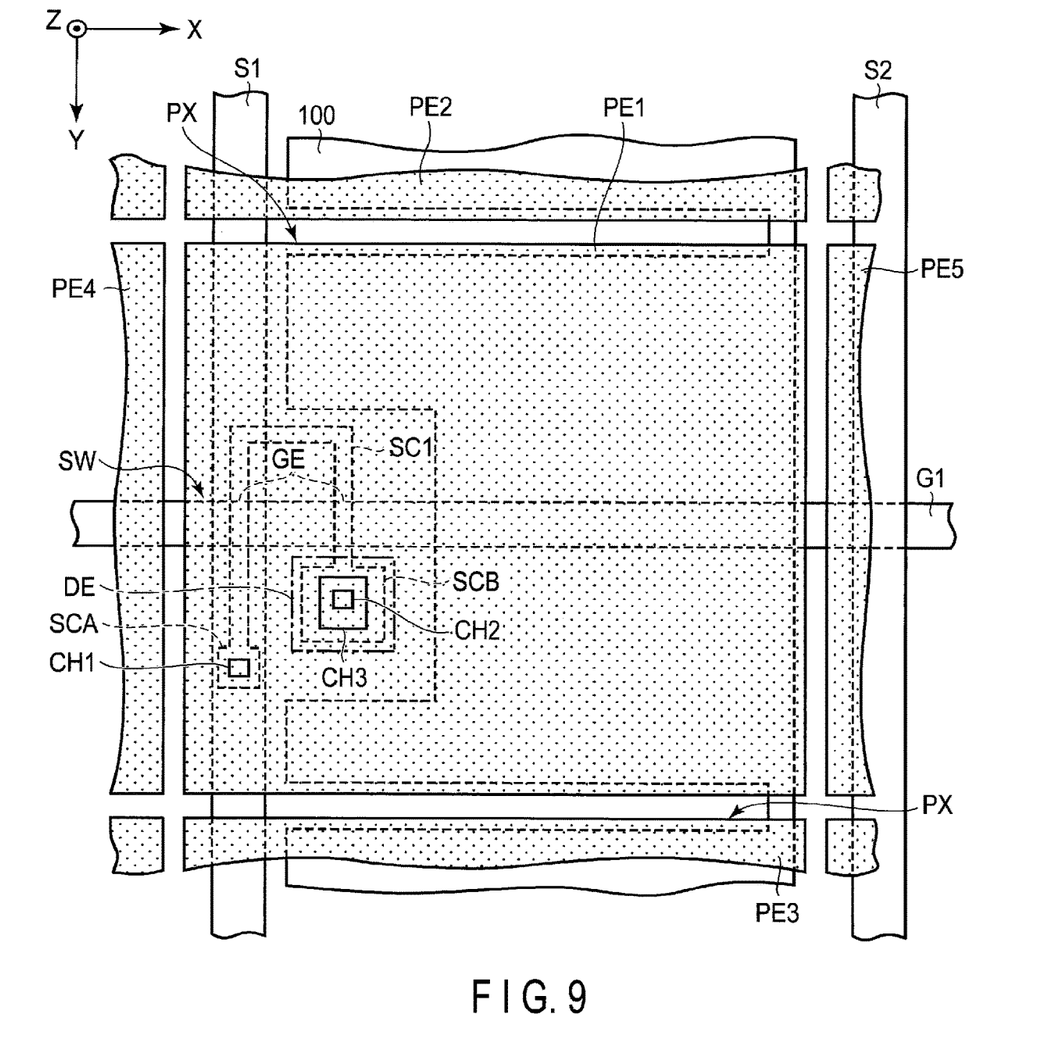
FIG. 9 is a plan view showing the fourth configuration example of the pixel PX of the display device DSP shown in FIG. 1.

FIG. 9 is a plan view showing the fourth configuration example of the pixel PX of the display device DSP shown in FIG. 1. The fourth configuration example shown in FIG. 9 differs from the first configuration example shown in FIG. 2 in the positional relationship between the switching element SW and the pixel electrode PE1. The pixel electrode PE1 overlaps the scanning line G1, the signal line S1 and the switching element SW. The scanning line G1 crosses each of the pixel electrode PE1 and the pixel electrodes PE4 and PE5 in planar view. The signal line S1 crosses each of the pixel electrodes PE1 to PE3 in planar view. The capacitance electrode 100 is narrowed at a position which does not overlap the pixel electrode PE1.

Also in the fourth configuration example, substantially the same effects as those of the first configuration example described above can be obtained.

Figure 10:
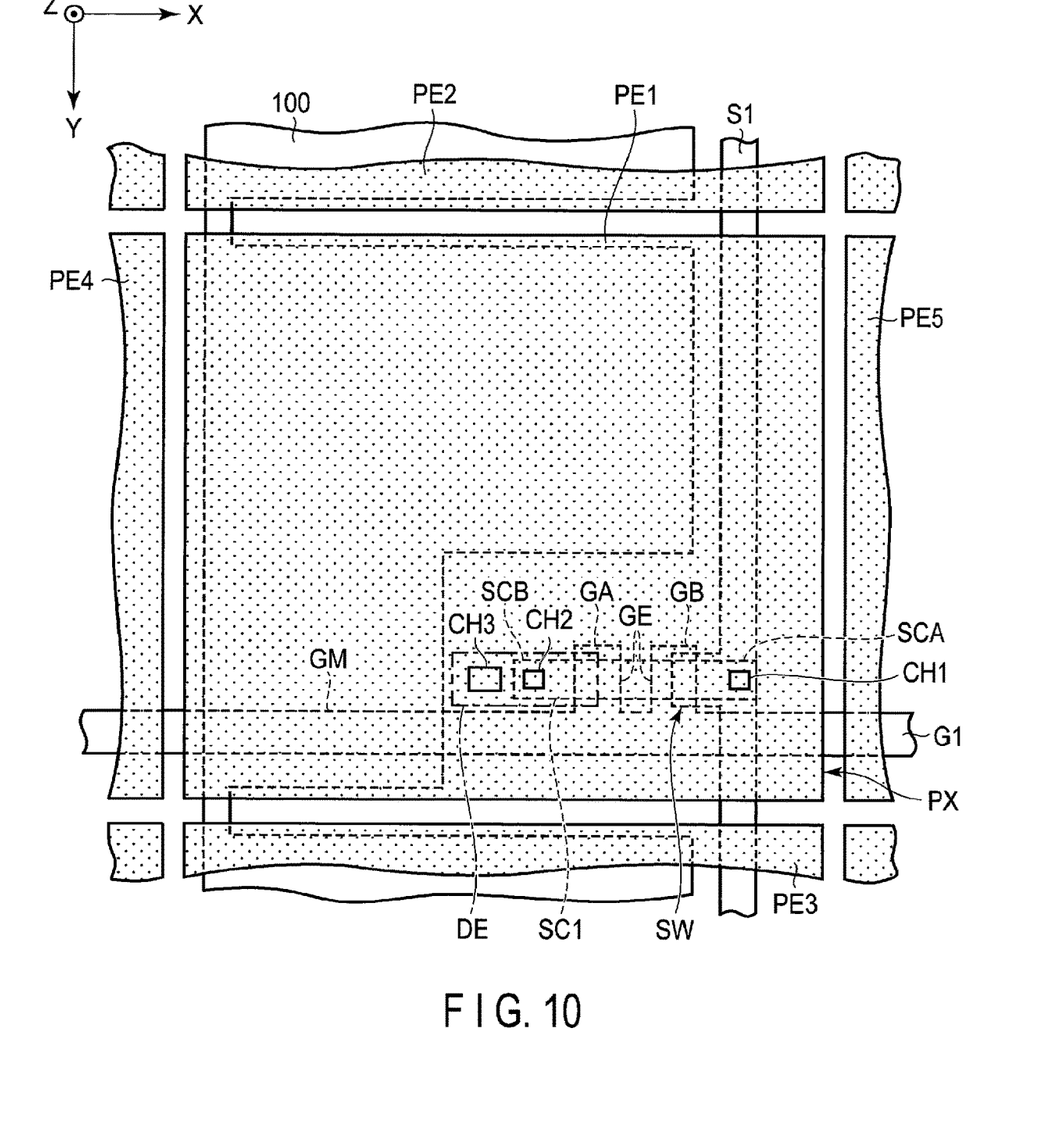
FIG. 10 is a plan view showing the fifth configuration example of the pixel PX of the display device DSP shown in FIG. 1.

FIG. 10 is a plan view showing the fifth configuration example of the pixel PX of the display device DSP shown in FIG. 1. The fifth configuration example shown in FIG. 10 differs from the first configuration example shown in FIG. 2 in the shape of the switching element SW. That is, the scanning line G has a main portion GM and branch portions GA and GB which are connected to the main portion GM. The main portion GM extends in the first direction X. The branch portions GA and GB extend in the second direction Y and are arranged in the first direction X.

The semiconductor layer SC1 extends in the first direction X. The end portion SCA is electrically connected to the signal line S1 in the through hole CH1. The end portion SCB overlaps the drain electrode DE and is electrically connected to the drain electrode DE in the through hole CH2. The semiconductor layer SC1 crosses the branch portions GA and GB between the end portion SCA and the end portion SCB. The gate electrode GE corresponds to areas overlapping the semiconductor layer SC1 of the branch portions GA and GB.

The pixel electrode PE1 is electrically connected to the drain electrode DE in the through hole CH3. The capacitance electrode 100 is narrowed at a position which does not overlap the pixel electrode PE1.

Also in the fifth configuration example, substantially the same effects as those of the first configuration example described above can be obtained.

As described above, the present embodiment can provide a display device and an array substrate which can simplify manufacturing processes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

An example of the display device obtained from the configurations disclosed in the specification will be additionally described below.

(1) A display device comprising:
a first substrate comprising a base, a scanning line located above the base, a semiconductor layer, a first inorganic insulating film located between the scanning line and the semiconductor layer, a first signal line crossing the scanning line and electrically connected to the semiconductor layer, a second inorganic insulating film having a main surface which contacts the first signal line and located between the semiconductor layer and the first signal line, a capacitance electrode contacting the main surface, a pixel electrode overlapping the capacitance electrode, and a third inorganic insulating film covering the first signal line and the capacitance electrode and located between the first signal line and the pixel electrode and between the capacitance electrode and the pixel electrode;
a second substrate comprising a common electrode; and
an electrophoretic element located between the pixel electrode and the common electrode.

(2) The display device of (1), wherein the electrophoretic element is bonded to the third inorganic insulating film on an outside of the pixel electrode.

(3) The display device of (1), wherein the first inorganic insulating film and the second inorganic insulating film are disposed in this order and no conductive layer is interposed between the base and the capacitance electrode.

(4) The display device of (1), further comprising a drain electrode which is electrically connected to the semiconductor layer and contacts the main surface, wherein
the third inorganic insulating film contacts the main surface between the drain electrode and the first signal line and between the drain electrode and the capacitance electrode.

(5) The display device of (1), wherein
the scanning line is located between the base and the first inorganic insulating film, and
the semiconductor layer is located between the first inorganic insulating film and the second inorganic insulating film.

(6) The display device of (1), wherein
the semiconductor layer is located between the base and the first inorganic insulating film, and
the scanning line is located between the first inorganic insulating film and the second inorganic insulating film.

(7) The display device of (1), wherein the first signal line and the capacitance electrode are formed of a same material.

(8) The display device of (1), further comprising a second signal line crossing the scanning line, wherein
the capacitance electrode is located between the first signal line and the second signal line and crosses the scanning line in planar view.

(9) The display device of (8), wherein a width of the capacitance electrode at a position which overlaps the scanning line is less than a width of the capacitance electrode at a position which does not overlap the scanning line.

(10) The display device of (8), wherein a width of the capacitance electrode on an outside of the pixel electrode is less than a width of the capacitance electrode at a position overlapping the pixel electrode.

(11) The display device of (8), wherein
the pixel electrode has a first edge portion close to the first signal line and a second edge portion close to the second signal line,
the capacitance electrode has a third edge portion close to the first signal line and a fourth edge portion close to the second signal line, and
the third edge portion and the fourth edge portion are located between the first edge portion and the second edge portion in planar view.

(12) An array substrate comprising:
a base;
a scanning line located above the base;
a semiconductor layer;
a first inorganic insulating film located between the scanning line and the semiconductor layer;
a signal line crossing the scanning line and electrically connected to the semiconductor layer;
a second inorganic insulating film having a main surface which contacts the signal line and located between the semiconductor layer and the signal line,
a capacitance electrode contacting the main surface;
a pixel electrode overlapping the capacitance electrode; and
a third inorganic insulating film covering the signal line and the capacitance electrode and located between the signal line and the pixel electrode and between the capacitance electrode and the pixel electrode.

What is claimed is:
1. A display device comprising:
a first substrate comprising a base, a scanning line located above the base, a semiconductor layer, a first inorganic insulating film located between the scanning line and the semiconductor layer, a first signal line crossing the scanning line and electrically connected to the semiconductor layer, a second inorganic insulating film having a main surface which contacts the first signal line and located between the semiconductor layer and the first signal line, a capacitance electrode contacting the main surface, a pixel electrode overlapping the capacitance electrode, and a third inorganic insulating film covering the first signal line and the capacitance electrode and located between the first signal line and the pixel electrode and between the capacitance electrode and the pixel electrode;
a second substrate comprising a common electrode; and
an electrophoretic element located between the pixel electrode and the common electrode.

2. The display device of claim 1, wherein the electrophoretic element is bonded to the third inorganic insulating film on an outside of the pixel electrode.

3. The display device of claim 1, wherein the first inorganic insulating film and the second inorganic insulating film are disposed in this order and no conductive layer is interposed between the base and the capacitance electrode.

4. The display device of claim 1, further comprising a drain electrode which is electrically connected to the semiconductor layer and contacts the main surface, wherein
the third inorganic insulating film contacts the main surface between the drain electrode and the first signal line and between the drain electrode and the capacitance electrode.

5. The display device of claim 1, wherein
the scanning line is located between the base and the first inorganic insulating film, and
the semiconductor layer is located between the first inorganic insulating film and the second inorganic insulating film.

6. The display device of claim 1, wherein
the semiconductor layer is located between the base and the first inorganic insulating film, and
the scanning line is located between the first inorganic insulating film and the second inorganic insulating film.

7. The display device of claim 1, wherein the first signal line and the capacitance electrode are formed of a same material.

8. The display device of claim 1, further comprising a second signal line crossing the scanning line, wherein
the capacitance electrode is located between the first signal line and the second signal line and crosses the scanning line in planar view.

9. The display device of claim 8, wherein a width of the capacitance electrode at a position which overlaps the scanning line is less than a width of the capacitance electrode at a position which does not overlap the scanning line.

10. The display device of claim 8, wherein a width of the capacitance electrode on an outside of the pixel electrode is less than a width of the capacitance electrode at a position overlapping the pixel electrode.

11. The display device of claim 8, wherein
the pixel electrode has a first edge portion close to the first signal line and a second edge portion close to the second signal line,
the capacitance electrode has a third edge portion close to the first signal line and a fourth edge portion close to the second signal line, and
the third edge portion and the fourth edge portion are located between the first edge portion and the second edge portion in planar view.

12. An array substrate comprising:
a base;
a scanning line located above the base;
a semiconductor layer;
a first inorganic insulating film located between the scanning line and the semiconductor layer;
a signal line crossing the scanning line and electrically connected to the semiconductor layer;
a second inorganic insulating film having a main surface which contacts the signal line and located between the semiconductor layer and the signal line;
a capacitance electrode contacting the main surface;

a pixel electrode overlapping the capacitance electrode; and a third inorganic insulating film covering the signal line and the capacitance electrode and located between the signal line and the pixel electrode and between the capacitance electrode and the pixel electrode.

13. The array substrate of claim 12, wherein
the first inorganic insulating film and the second inorganic insulating film are disposed in this order and no conductive layer is interposed between the base and the capacitance electrode.

14. The array substrate of claim 12, further comprising a drain electrode which is electrically connected to the semiconductor layer and contacts the main surface, wherein
the third inorganic insulating film contacts the main surface between the drain electrode and the signal line and between the drain electrode and the capacitance electrode.

15. The array substrate of claim 12, wherein
the scanning line is located between the base and the first inorganic insulating film, and
the semiconductor layer is located between the first inorganic insulating film and the second inorganic insulating film.

16. The array substrate of claim 12, wherein
the semiconductor layer is located between the base and the first inorganic insulating film, and
the scanning line is located between the first inorganic insulating film and the second inorganic insulating film.

17. The array substrate of claim 12, wherein the signal line and the capacitance electrode are formed of a same material.

18. The array substrate of claim 12, wherein a width of the capacitance electrode at a position which overlaps the scanning line is less than a width of the capacitance electrode at a position which does not overlap the scanning line.

19. The array substrate of claim 12, wherein a width of the capacitance electrode on an outside of the pixel electrode is less than a width of the capacitance electrode at a position overlapping the pixel electrode.

* * * * *